（12) United States Patent
Hess

(10) Patent No.: US 10,962,601 B2
(45) Date of Patent: Mar. 30, 2021

(54) METHOD AND SYSTEM FOR DETERMINING OPEN CONNECTIONS IN A BATTERY PACK

(71) Applicant: BAE Systems Controls Inc., Endicott, NY (US)

(72) Inventor: Robert A. Hess, Seneca Falls, NY (US)

(73) Assignee: BAE Systems Controls Inc., Endicott, NY (US)

( * ) Notice: Subject to any disclaimer, the term of this patent is extended or adjusted under 35 U.S.C. 154(b) by 391 days.

(21) Appl. No.: 16/130,688

(22) Filed: Sep. 13, 2018

(65) Prior Publication Data

US 2020/0088800 A1    Mar. 19, 2020

(51) Int. Cl.

| | |
|---|---|
| *G01R 31/396* | (2019.01) |
| *G01R 31/36* | (2020.01) |
| *G01R 19/165* | (2006.01) |
| *G01R 31/389* | (2019.01) |
| *G01R 31/3842* | (2019.01) |

(52) U.S. Cl.
CPC ..... *G01R 31/396* (2019.01); *G01R 19/16542* (2013.01); *G01R 31/3648* (2013.01); *G01R 31/389* (2019.01); *G01R 31/3842* (2019.01)

(58) Field of Classification Search
CPC .................................................. G01R 31/396
See application file for complete search history.

(56) References Cited

U.S. PATENT DOCUMENTS

| | | | |
|---|---|---|---|
| 5,773,977 A | 6/1998 | Dougherty | |
| 8,502,541 B2 | 8/2013 | Chalfant et al. | |
| 9,140,761 B2 | 9/2015 | Ishishita | |
| 9,774,197 B1 | 9/2017 | Li et al. | |
| 9,865,902 B2 | 1/2018 | Paganelli et al. | |
| 2008/0091362 A1 | 4/2008 | Tae et al. | |
| 2011/0172939 A1 | 7/2011 | Uprety et al. | |
| 2012/0105071 A1 | 5/2012 | Chalfant et al. | |
| 2015/0070024 A1* | 3/2015 | Kim ..................... | H01M 10/48 324/430 |
| 2017/0062878 A1 | 3/2017 | Povey et al. | |
| 2017/0201103 A1 | 7/2017 | Jeon et al. | |
| 2017/0203660 A1 | 7/2017 | He et al. | |

OTHER PUBLICATIONS

An et al., "Rate dependence of cell-to-cell variations of lithium-ion cells", Oct. 11, 2016, pp. 1-7, Scientific Reports, www.nature.com/scientificreports.

* cited by examiner

*Primary Examiner* — Manuel A Rivera Vargas
(74) *Attorney, Agent, or Firm* — Scully Scott Murphy & Presser PC

(57) ABSTRACT

A method and system to determine if there is an open cell in a battery pack of cells arranged in a lattice. Voltage measurements from each parallel cell group along with information on the battery pack topology are used to estimate the resistance of each cell group. The resistance of each cell group is calculated based on the measured voltage less a nominal open circuit voltage divided by the current level of the battery pack. The average cell group resistance of the battery pack is also calculated. The cell group resistances are analyzed statistically using the resistance of each cell group and the average cell group resistance to reveal outliers which are indicative of open cell groups.

27 Claims, 5 Drawing Sheets

METHOD AND SYSTEM FOR DETERMINING OPEN CONNECTIONS IN A BATTERY PACK

FIELD OF DISCLOSURE

The present disclosure relates to battery management of high capacity battery packs and more particularly to determination of an open cell in a battery pack.

BACKGROUND

High capacity battery packs are used for both high energy applications, such as electric vehicles or grid storage, as well as high power applications, such as hybrid electric vehicle propulsion or equipment power needs or engine start operations. The electric and hybrid electric vehicles may include automobiles, aircraft, underwater vehicles or any other application in which high energy or power is provided by a high capacity battery pack. Such battery packs are comprised of multiple individual cells, arranged in a lattice. Each row in the lattice is comprised of a group of cells connected in parallel. As each cell has a nominal voltage, the total pack voltage is determined by the number of rows of parallel cell groups. The total energy and power is subsequently established by selecting the number of cells to be connected in parallel.

Proper management of the battery pack requires that the voltage of each parallel cell group is understood. Variability in each cell (and subsequently each cell group) means that the power delivered by each cell group will be different. Each cell may have both capacity and internal resistance differences. This forces each cell group to deliver different power. As the cells are charged or discharged, the voltage across the cell groups will be different. Though each parallel cell group sees the same current as all the other cells groups in the series lattice, the total current through each cell will be slightly different. With proper sizing of the pack, this variability will have little effect of the pack performance or its capacity over time.

Large capacity packs utilize a number of methods to manage the cells and pack. Basic pack-level over-voltage, under-voltage and over-temperature monitors are used to make sure the pack is not operated at warm conditions or to insure the cells are not damaged by improper overcharging or undercharging the cells. Each cell group is typically managed to assess its voltage with respect to the other cells groups. Various schemes are used to balance the voltage of each cell group, keeping them the same. This is used to insure cell-level voltage levels are not too high or too low, thereby extending the life of the battery pack.

In the event of an open connection within a cell, or if a cell is electrically disconnected from the cells in its parallel group e.g., broken weld, etc.), then the remaining cells will carry more current. This means that the remaining cells will experience higher resistive heating and will experience accelerated capacity fade as compared to the other cells. A method to determine such open circuits in parallel cell groups is required to properly manage high-capacity battery packs.

Loss of one or more cells in a battery pack can manifest itself in a number of ways. Loss of a cell means that the total capacity of the pack is decreased. As pack capacity and voltage are typically related, measuring the pack-level voltage after a controlled discharge is performed. In other approaches, the voltage across each cell group is measured when the pack is not under load (the open circuit voltage) and at some predefined time as the pack is charging or discharging. The voltage differences between the open circuit voltage and voltage under load for each cell group is compared to a predefined level. If the difference is greater than the predefined level, then an open cell is declared. Both of these approaches assume a specific load is applied. However, the voltage of each cell group will vary as a function of load and as each cells ages (as cells age, their internal resistance increases). For certain applications, the actual load may vary. For example, the power required to start a very cold engine is different than that for a warm engine. Comparing the voltage change to a fixed value is not useful as loads vary or as the cells age.

Some techniques use voltage and current measurements within the pack to develop state-of-health indicators. These have some ability to determine if there is a problem with pack. However, it is not always practical to provide both voltage and current measurements within a battery pack.

SUMMARY

In one embodiment, a method and system to determine if there is an open cell in a large battery pack comprised of cells arranged in a lattice is disclosed. The methodology and system uses voltage measurements from each parallel cell group along with information on the battery pack topology to estimate the resistance of each cell group. The cell group resistances are analyzed statistically to reveal outliers which are indicative of open cell groups. The method and system does not presuppose specific charge/discharge cycles and does not require pack or cell group current measurements.

In one embodiment, there is disclosed a method for determining open connections in a cell group of a battery pack. The battery pack includes a plurality of cell groups connected in series, the cell groups are formed of a plurality of battery cells connected in parallel. In one embodiment, the method includes the steps of measuring the voltage of each cell group of the plurality of cell groups as a function of time, obtaining a current level of the battery pack as a function of time, calculating the resistance of each cell group as a function of time based on the measured voltage less a nominal open circuit voltage divided by the current level of the battery pack, calculating the average cell group resistance of the battery pack as a function of time, determining that a cell group has an open connection based on the resistance of each cell group and the average cell group resistance and providing a signal in response to the determining step. In one embodiment, statistical analysis is used for determining that a cell group has an open connection. In one embodiment, the statistical analysis includes comparing a mean cell group resistance to the average cell group resistance.

A computer system that includes one or more processors operable to perform one or more methods described herein also may be provided.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

Figure 1:
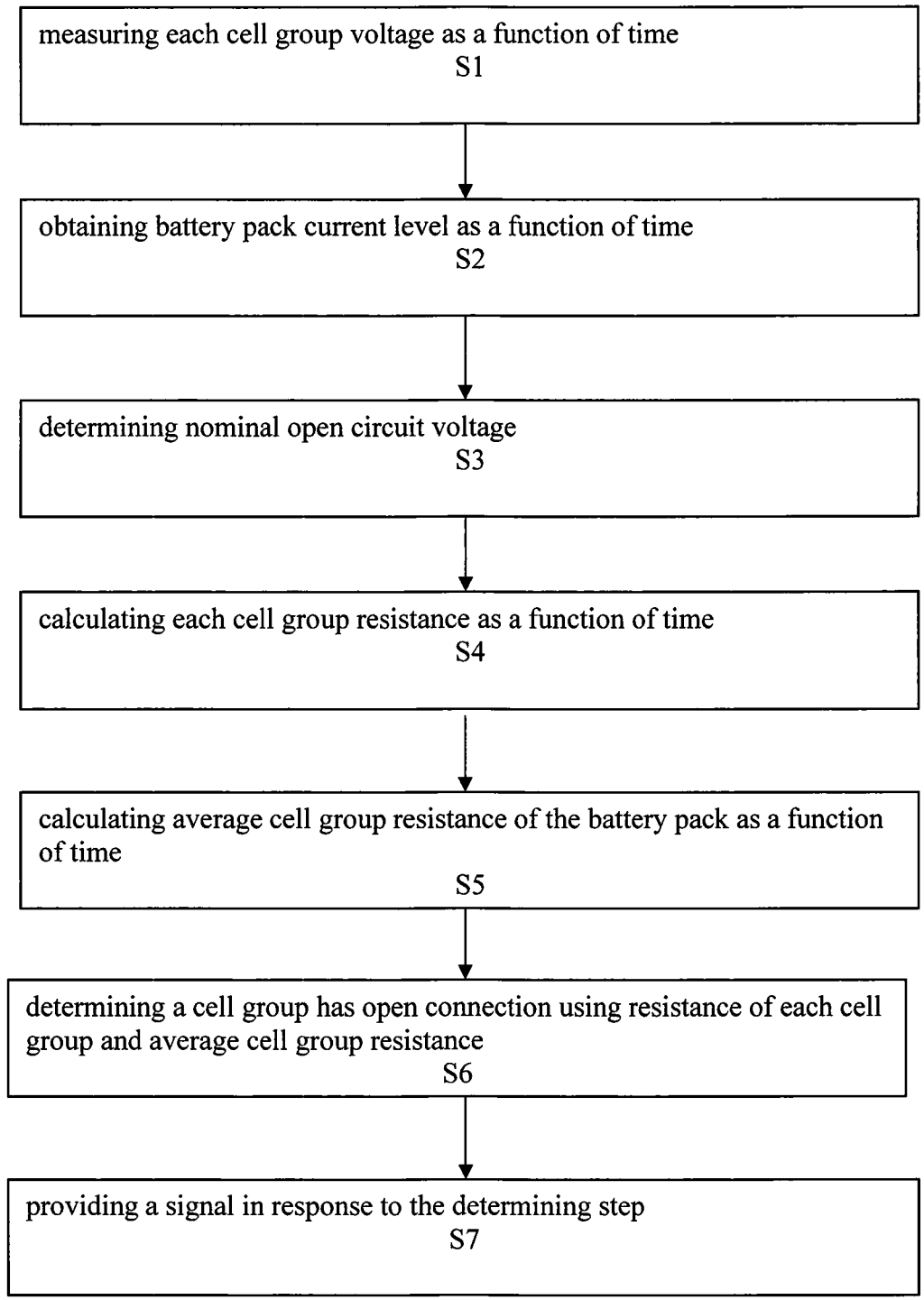
FIG. 1 is a flow diagram of one embodiment of a method for determining open connections in a battery pack according to the present disclosure.

In one embodiment, a fault detection method and system to determine if there is an open cell in a large battery pack comprised of cells arranged in a lattice is disclosed. The method and system uses voltage measurements from each parallel cell group along with information on the battery pack topology to estimate the resistance of each cell group. The cell group resistances are analyzed statistically to reveal outliers which are indicative of open cell groups. The method and system does not presuppose specific charge/discharge cycles and does not require pack or cell group current measurements.

The embodiments of the invention described in the present disclosure are an improvement upon prior art battery management systems by providing a method and system that determines if there is a cell open circuit in a battery pack without use of current measurement that is independent of the applied load and insensitive to cell ageing.

As used herein, the following symbols are defined as follows:
Cp specific heat coefficient
Iest estimated current
Ip pack current
k tuning parameter for detection
m cell mass
Ni number of operating cells in the ith cell group
Ns number of series parallel cell groups
Np nominal total number of cells per group (operating or not)
Pc power through each cell
Ravc average cell group resistance
Rc nominal cell resistance
Ri resistance in the ith cell group
Rmean mean resistance across all cell groups
Rp nominal pack resistance
SOC state of charge
T temperature
t time
Vi voltage of the ith cell group
Voc nominal cell open circuit voltage
Vp nominal pack voltage
ΔT temperature change
σR cell group resistance standard deviation In one embodiment, the battery pack is configured to be used for a high-power discharge operation. One example of such an operation is as part of an engine start of a hybrid electric vehicle (HEV) or electric vehicle (EV). The battery pack is managed by a battery management system (BMS). The BMS is responsible for monitoring pack voltage and temperature. The BMS also performs voltage monitoring of each cell group. The BMS controls cell balancing and pack recharging. In one embodiment, the pack is recharged and balanced between each high-power discharge operation.

The battery pack is comprised of Ns parallel cell groups arranged in series. The pack voltage, Vp is related to the voltage of each of the Ns cell groups by the equation $$Vp = \Sigma_{i=1}^{Ns} Vi \qquad \text{Eqn. 1}$$

Given each cell has a nominal resistance of Rc, the nominal resistance of the pack is given by the equation $$Rp \cong \frac{NsRc}{Np} \qquad \text{Eqn. 2}$$

The resistance of the ith parallel string is given by $$Ri \cong \frac{Rc}{Ni} \qquad \text{Eqn. 3}$$

Inspection of Equation 3 reveals that if there is an open cell, at which case Ni<Np, then the overall resistance of the ith string will be greater than the nominal cell group impedance, Rc/Np.

In one embodiment, because the fault detection method and system disclosed herein uses statistical analysis to detect relative changes in the cell group resistance, which enables certain assumptions to be relied upon as noted below which simplify the calculations performed by the system according to the method.

Initially, it is noted that the actual cell resistance is typically a function of its temperature and the total time of usage the cell has experienced. All the cells in the pack are assumed to be at the same temperature and have been exposed to the same usage.

There are a number of methods to model the behavior of batteries. Several of these models assume the battery is comprised of a voltage supply and internal impedance. The impedance may be a simple resistive element, or a combination of resistive and capacitive elements. For the purpose of this analysis, the cell impedance is assumed to be resistive.

The model for a single cell (or cell group) is given by the equation $$Vi(t) \cong Voc + Rc \frac{Ip(t)}{Np} \qquad \text{Eqn. 4}$$

Note that the open circuit voltage (Voc) is typically a function of the state-of-charge. Each cell is assumed to be recharged and balanced and each cell is at the same initial voltage. If the discharge is for a short duration and the overall pack capacity is large, the SOC does not vary significantly during the discharge.

Inspection of Eq. 4 shows that that cell resistance Rc is independent of voltage and current.

During the discharge, the current through the cell coupled with the cell resistance causes heat to be generated, thereby leading to cell heating. The heat generated by each cell is given by $$Pc(t) = \left(\frac{Ip(t)}{Np}\right)^2 Rc \qquad \text{Eqn. 5}$$

The total energy generated by the discharge is given by $$Qc = \int Pc(t)dt \qquad \text{Eqn. 6}$$

If all the energy is absorbed by the cell and leads to cell heating, then the change in temperature is then computed from the cell mass and specific heat by $$\Delta T = \frac{Qc}{mcp} \qquad \text{Eqn. 7}$$

If the cell resistance as a function of temperature, cell mass, cell specific heat, and nominal cell current are the same, then each cell would see a similar temperature rise over the period. The resulting cell resistance is then assumed to change for all the cells as a function of the temperature change is the same.

If the behavior of each cell in the parallel cell groups is the same during the discharge, similar voltage changes would be expected. However, as noted in Equation 3, an open cell (due to an internal cell open or an open connection in the parallel group), would be reflected in effective increase of the parallel group resistance (and resulting differences in the cell group voltage as the cell charges/discharges).

Given the assumptions that the cell resistance (and group resistance) are generally similar and only weakly influenced by the current (in the form of heating), the method and system according to one embodiment of the disclosure uses cell group resistance as the means to determine if there is an open cell or cells in a battery pack. In one embodiment, the relative cell group resistance is compared to one another to determine if there is an open cell(s) which is both independent of load and aging.

By recasting Equation 4, an expression for the resistance of the ith cell group at time t is:

$$Ri(t) = \frac{Np(Vi(t) - Voc)}{Ip(t)} \qquad \text{Eqn. 8}$$

If a pack-level current measurement is not available, Ip(t) can be approximated by $$Iest(t) = \frac{Np(\sum_i Vi - NpVoc)}{NsRc} \qquad \text{Eqn. 9}$$

High capacity battery packs are comprised of hundreds (or thousands) in individual cells. As such, the presence of a few open cells will not appreciable effect the estimated current.

The resulting method to determine cell group resistance is given by the algorithm.
If T is available
Compute Rc(T)
else
Set Rc to default value
Set Voc, Ns, Np
For each t
Measure Vi(t)
Compute Iest(t) (using Eqn. 9)
Compute Ri(t) (using Eqn. 8)

Though there should be a constant value for Ri, measurement error in the voltage will cause some variation. The average resistance for each cell group is then determined.

$$Ravei = \text{Average}(Ri(t))_{\text{for those } t \text{ where } Iest(t) > \varepsilon} \qquad \text{Eqn. 10}$$

For those conditions where the estimated current is very small, using it in a divisor will lead to numeric error. Data is only used when the current is of sufficient magnitude to avoid dividing by a small number (e.g., |Iest|>0.1 A).

In one embodiment, the method and system applies statistical analyses to see if there is a cell group resistance outlier.

The mean cell group impedance is defined:

$$Rmean = \frac{\sum_i Ravei}{Ns} \qquad \text{Eqn. 11}$$

With a standard deviation, σR given by $$\sigma R = \text{Max}\left(\sqrt{\frac{\sum_i (Ravei - Rmean)^2}{Ns - 1}}, \frac{k}{Np}\right) \qquad \text{Eqn. 12}$$

In one embodiment, in the event there is an open cell, the relative difference from the mean can be of the order of ~1/Np. A minimum bound is defined for the σR value to ignore those cases where there is no fault. The value of k would be set to limit false alarms.

In one embodiment, the average cell group resistance is compared to the mean resistance to determine if there is an open in a cell group.
For each i
If Abs(Ravei−Rmean)>2 σR
Open in Group i (In this case an Alert signal is provided)
If Abs(Ravei−Rmean)>σR
Possible Open in Group i (In this case a Warning signal is provided)

In one embodiment, the method and system takes into consideration the effect of variation of the measurements on the quality of the estimator. In one embodiment, a value of 0.004 for the coefficient of variation at 25 deg C. and a value of 0.015 at −20 deg C. is used based on known actual variations in cell resistance for typical lithium ion cells. The coefficient of variation is the standard deviation divided by the mean.

In one example embodiment, a model of a battery pack was created using a hypothetical lithium ion cell modeled with a Voc of 4.2 V (100% SOC) and a nominal cell impedance, Rc, of 50 mOhm at 25 deg C. and 300 mOhm at −20 deg C. The pack was arranged in a 44S15P configuration. A 44S15P configuration is 15 cells connected in parallel and 44 parallel groups connected in series. For example, Eqn. 2 would be 44Rc/15, where Re is the single cell resistance, the total resistance is Rp.

The pack is assumed fully charged at the start of the run and all the cell groups are balanced. The model allows the number of cells in each parallel group to be adjusted to reflect the actual number of cells (for example, 14 cells may be connected in a group instead of the nominal 15 cells.

The 44S15P pack model is exposed to a 30 Amp discharge. The discharge ramps up to 30 Amps in 1 second and then holds steady for the next 13.5 seconds. The load is removed and the model continues to run for 0.5 seconds. This constitutes a 15 second detection period. Simulation runs were performed at −20 deg C. and 25 deg C. with multiple open cell configurations. Variation in cell resistance for each group was included in the model. The model also includes measurement noise in the cell group voltage measurements (assuming a random distribution of +/−0.01 V). The simulation is run at a 0.05 second update rate.

Runs at cold (−20 deg C.) and warm (25 deg C.) conditions were made and the following fault conditions were found: (no open cells, 1 open cell on cell group 3, an open cell on cell groups 3 and 5, 2 open cells on cell group 3 combined with one open on cell group 5, and 5 open cells on cell group 3 combined with one open cell on cell group 5).

Each of the simulations were run 20 times to assess how the voltage measurement error or resistance variations would manifest themselves. The simulation was in the form of a Microsoft Excel model using the RANDBETWEEN function. Each run was recalculated to get all new random values.

In one embodiment, the fault detection method and system returns a Warning message for a possible open cell in a cell group or an Alert message if there is high confidence of an open in a cell group. A Warning or Alert message would signal the need for maintenance inspection. In one embodiment, setting the factor k in Eqn. 12 as a function of temperature can improve performance.

As shown in FIG. 1, in one embodiment, a method for determining open connections in a cell group of a battery pack of a plurality of parallel cell groups connected in series starts at step S1 of measuring the voltage of each cell group of the plurality of cell groups as a function of time, step S2 of obtaining a current level of the battery pack as a function of time, step S3 of determining nominal open circuit voltage, step S4 of calculating the resistance of each cell group as a function of time based on the measured voltage less a nominal open circuit voltage divided by the current level of the battery pack, step S5 of calculating the average cell group resistance of the battery pack as a function of time, step S6 of determining that a cell group has an open connection based on the resistance of each cell group and the average cell group resistance and step S7 of providing a signal in response to the determining step.

In one embodiment step S1 includes measuring the current level of the battery pack and step S2 includes calculating the estimated current level of the battery pack.

Figure 2:
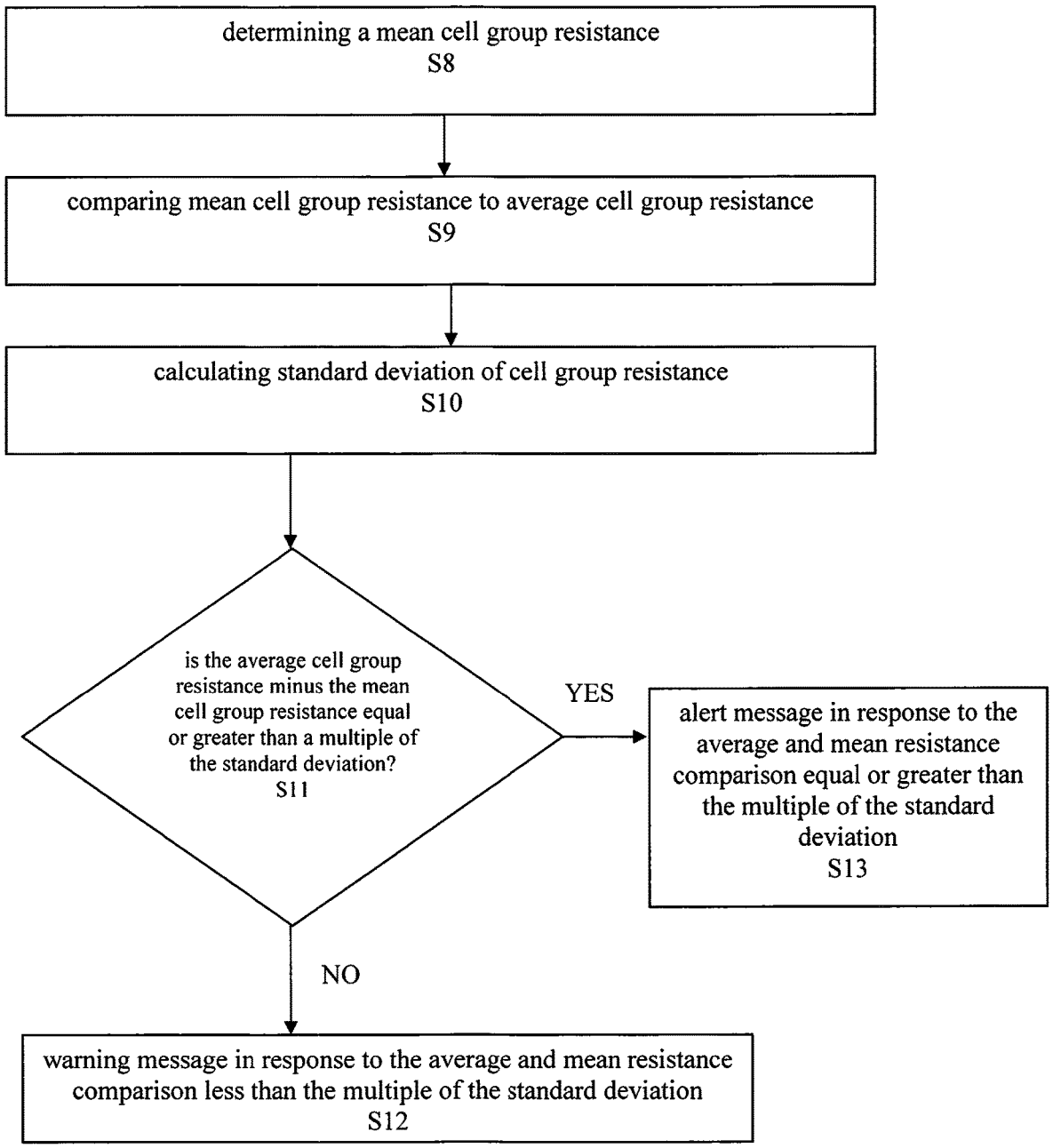
FIG. 2 is a flow diagram of one embodiment of a method for determining open connections in a battery pack according to the present disclosure.

In one embodiment, determining that a cell group has an open connection uses statistical analysis. As shown in FIG. 2, the use of statistical analysis includes step S8 of determining a mean cell group resistance and step S9 of comparing mean cell group resistance to the average cell group resistance. In one embodiment, step 9 is performed by calculating the average cell group resistance minus the mean cell group resistance. The method includes step S10 of calculating a standard deviation of the cell group resistance based on the comparison of step 9. In one embodiment, the standard deviation of the cell group resistance calculated in step S10 includes setting a tuning parameter as a function of temperature.

As shown in FIG. 2, in one embodiment, the method further includes step S11 of determining whether the comparison of the average cell group resistance and the mean cell group resistance is greater than a multiple of the standard deviation. In one embodiment, in step S12 a warning message is provided in response to the average cell group resistance minus the mean cell group resistance being less than the multiple of the standard deviation and in step S13 an Alert message is provided in response to the average cell group resistance minus the mean cell group resistance being equal to or greater than the multiple of the standard deviation.

In one embodiment, the methodology disclosed herein can be implemented in an existing Battery Management System (BMS). Existing cell group voltage monitors and pack-level temperature monitors used for pack management would be used to collect the requisite voltage measurements. These would be stored as time histories in memory in the BMS. In one embodiment, where the battery pack is used for an engine start application, the method would be initiated at power up. After a signal has been received that the engine start is completed, the BMS can compute if there are any open cells in the battery pack from the time history. In the event there is no signal, the data could be collected for a predefined time period and then proceed to the open cell computations. The BMS could store any fault indications and communicate these (in the form of discrete or digital messages). The BMS would be able to perform battery pack charging and cell balancing if there are no faults.

Figure 3:
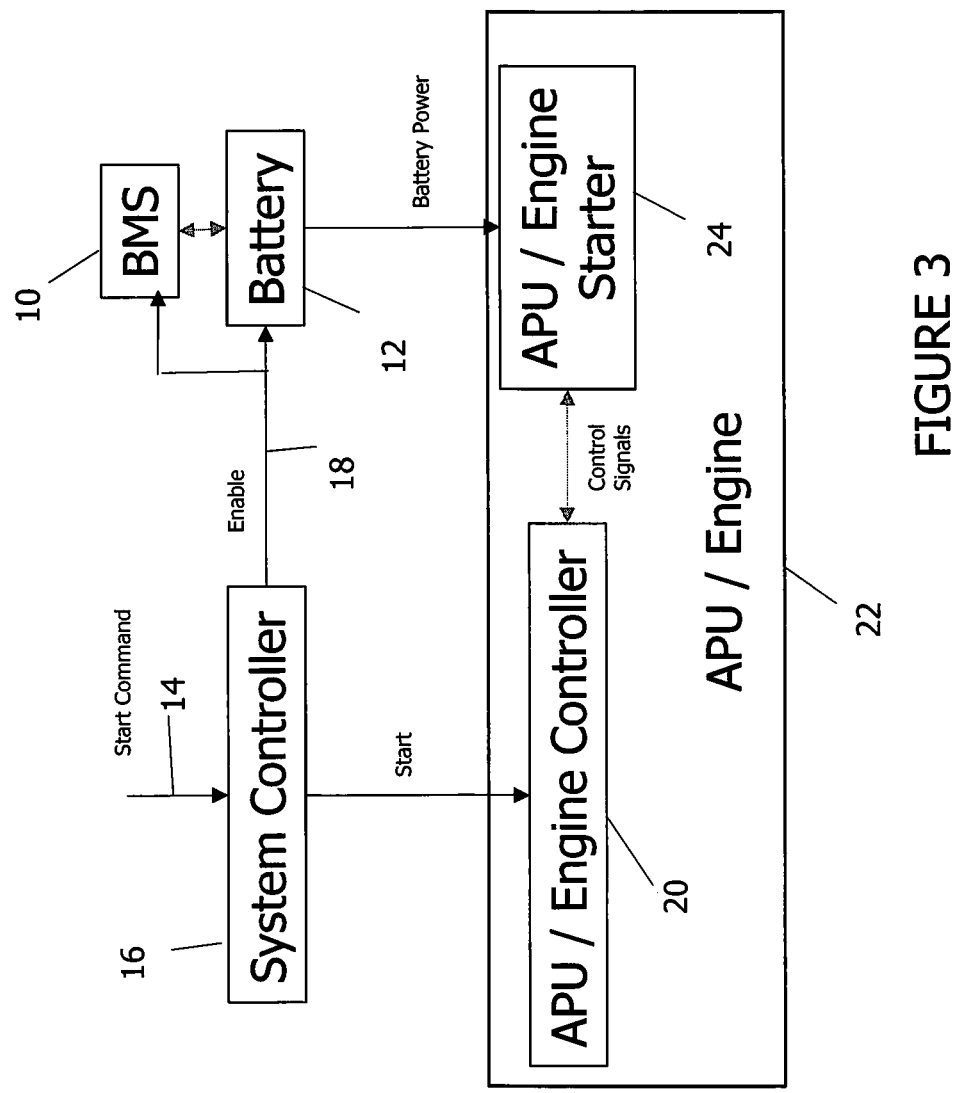
FIG. 3 is a block diagram of one embodiment for determining open connections in a battery pack in an engine startup system according to the present disclosure.

FIG. 3 is one embodiment of an engine startup application for any type of vehicle or high power electrical system. The BMS 10 is connected to the battery pack 12 to perform the various battery management functions. In the startup application, an operator of the vehicle or system issues a start command 14 to the system controller 16. The system controller 14 issues a start enable signal 18 to the battery pack 12 and the BMS 10. The battery pack 12 is enabled and the BMS starts the open cell detection processing of the battery pack. The system controller issues a start signal to the auxiliary power unit (APU) or the engine controller 20 of the vehicle or system APU or engine 22. The APU or engine 24 starter is enabled to start the APU/engine. The open cell detection processing completes after a predetermined period of time. The time period for the open cell detection processing may depend on the particular type of vehicle and typically varies from a few seconds to over 100 seconds.

In addition to the engine startup application, the open circuit monitoring disclosed herein can take place as part of a maintenance test or part of normal vehicle or system operation.

Figure 4:
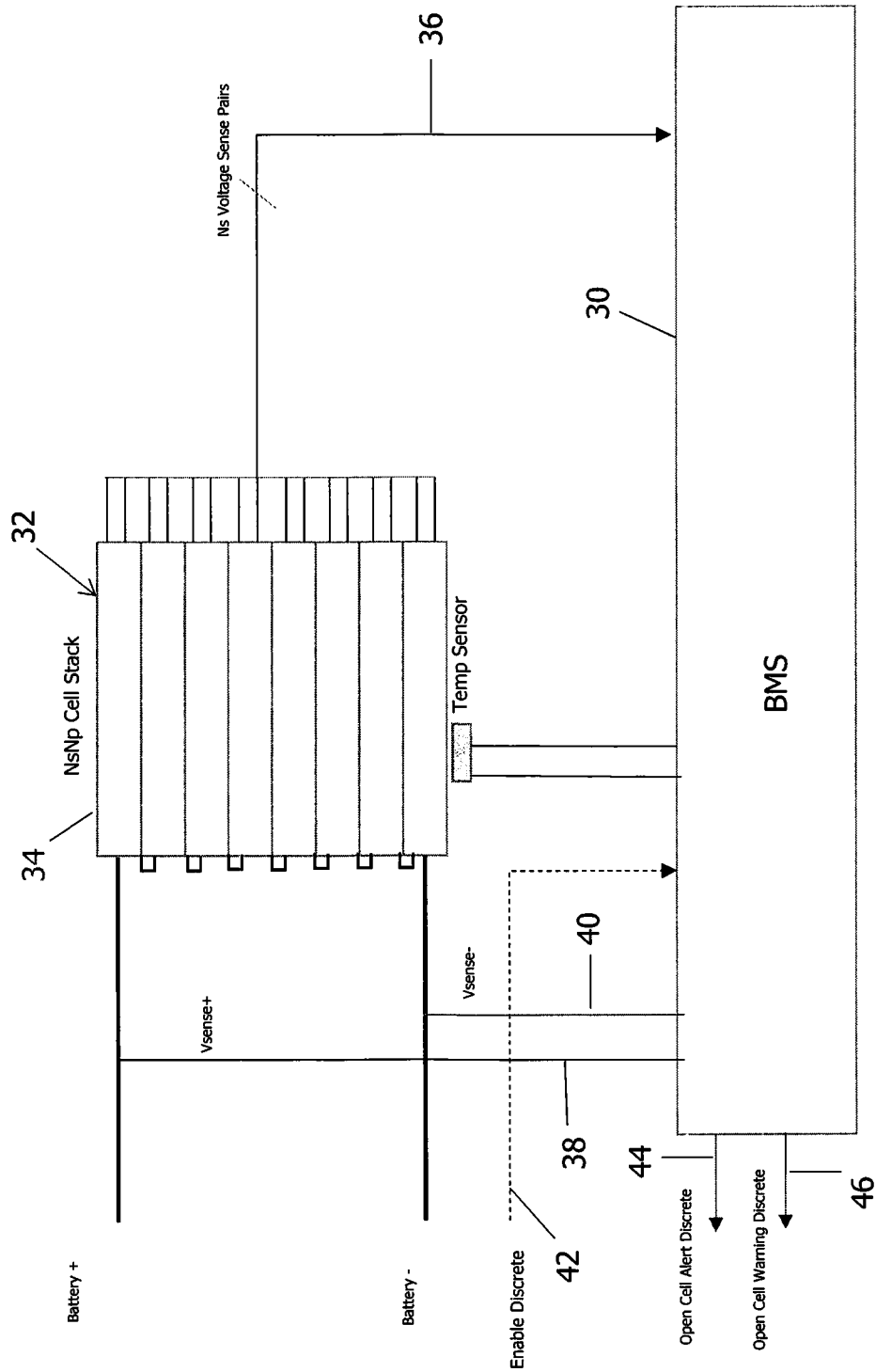
FIG. 4 is a block diagram of one embodiment of a system for determining open connections in a battery pack according to the present disclosure.

FIG. 4 is one embodiment of a BMS 30 connected to a battery pack 32. In one embodiment, BMS 30 includes monitoring board with one or more microprocessors and measurement circuits. Other implementations of the BMS such as by various computer systems, software and combinations thereof are contemplated, such as will be described below.

In one embodiment, battery pack 32 consist of an NsNp cell stack. In one embodiment, each layer 34 of the stack 32 represents one parallel cell group of cells connected in parallel. The number of parallel groups and cells in the parallel groups is not critical to the invention as that would be specific to a particular application.

The BMS 30 measures the voltage of each cell group by measuring the Ns plus and minus voltage pairs of each cell group from the signals input on line 36. There would be 2 measurements of voltage across each cell group to determine Vi (Vi=$Vsense_{+i}$−$Vsense_{-i}$). Note that in the case where all the cell groups are in series, the sense on the + side of one cell group is identical to the sense on the − side of the next cell group. In a different implementation, the BMS 30 can perform the detection with Ns+1 voltage sense lines instead of 2 Ns voltage sense lines.

The BMS 30 measures Vsense+ at line 38 and Vsense− at line 40 for measuring the total voltage of the entire battery stack 32. This measurement is used to determine Vp from Eqn. 1 (Vp=$Vsense_+$−$Vsense_-$) and may be used in other aspects of the BMS 30 not relevant to the open cell detection processing.

As described above, in response to an enable signal 42, and the measurements made, BMS 30 determines the resistance of each cell group using Eqn. 8, estimates the pack level current using Eqn. 9, and determines the average resistance for each cell group using Eqn. 10. The BMS 30 then applies statistical analysis, such as that shown using Eqns. 11 and 12. Based on the results of the statistical analysis, an open cell alert is issued at 44 or an open cell warning is issued at 46.

Figure 5:
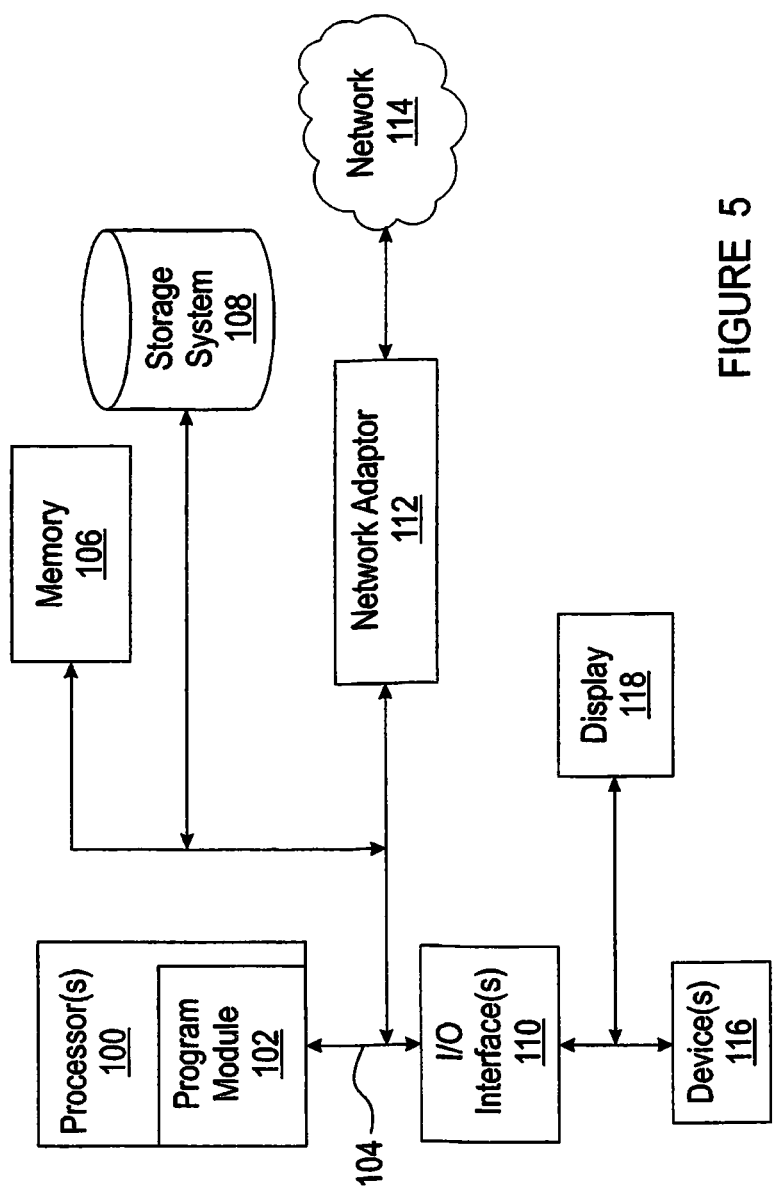
FIG. 5 is a block diagram of an exemplary computing system suitable for implementation of the embodiments of the invention disclosed in this specification.

FIG. 5 illustrates a schematic of an example computer or processing system that may implement the method for determining open connections in a cell group of a battery pack in one embodiment of the present disclosure. The computer system is only one example of a suitable processing system that may be used to implement the BMS 30 and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 5 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The components of computer system may include, but are not limited to, one or more processors or processing units 100, a system memory 106, and a bus 104 that couples various system components including system memory 106 to processor 100. The processor 100 may include a program module 102 that performs the methods described herein. The module 102 may be programmed into the integrated circuits of the processor 100, or loaded from memory 106, storage device 108, or network 114 or combinations thereof.

Bus 104 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system may include a variety of computer system readable media. Such media may be any available media that is accessible by computer system, and it may include both volatile and non-volatile media, removable and non-removable media.

System memory 106 can include computer system readable media in the form of volatile memory, such as random access memory (RAM) and/or cache memory or others. Computer system may further include other removable/non-removable, volatile/non-volatile computer system storage media. By way of example only, storage system 108 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 104 by one or more data media interfaces.

The computer system may also communicate with one or more external devices 116 such as a keyboard, a pointing device, a display 118, etc.; one or more devices that enable a user to interact with computer system; and/or any devices (e.g., network card, modem, etc.) that enable computer system to communicate with one or more other computing devices. Such communication can occur via Input/Output (I/O) interfaces 110.

Still yet, the computer system can communicate with one or more networks 114 such as a local area network (LAN), a general wide area network (WAN), and/or a public network (e.g., the Internet) via network adapter 112. As depicted, network adapter 112 communicates with the other components of computer system via bus 104. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the open circuit monitoring methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other components and functionality not reflected in the illustrations will be apparent in light of this disclosure, and it will be appreciated that other embodiments are not limited to any particular hardware or software configuration. Thus in other embodiments system may comprise additional, fewer, or alternative subcomponents as compared to those included in the example embodiments.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments disclosed herein. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure not be limited by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A computer implemented method for determining open connections in a cell group of a battery pack, the battery pack comprising a plurality of cell groups connected in series, the cell groups comprising a plurality of battery cells connected in parallel, the method comprising:
   measuring the voltage of each cell group of the plurality of cell groups as a function of time;
   obtaining a current level of the battery pack as a function of time;
   calculating the resistance of each cell group as a function of time based on the measured voltage less a nominal open circuit voltage divided by the current level of the battery pack;
   calculating the average cell group resistance of the battery pack as a function of time;
   determining that a cell group has an open connection based on the resistance of each cell group and the average cell group resistance; and
   providing a signal in response to the determining step.

2. The computer implemented method of claim 1, wherein determining that a cell group has an open connection comprises using statistical analysis.

3. The computer implemented method of claim 2, wherein the statistical analysis includes comparing a mean cell group resistance to the average cell group resistance.

4. The computer implemented method of claim 1, wherein obtaining the current level of the battery pack comprises measuring the current level of the battery pack.

5. The computer implemented method of claim 1, wherein obtaining the current level of the battery pack comprises calculating the estimated current level of the battery pack.

6. The computer implemented method of claim 2, wherein the statistical analysis includes determining a standard deviation of the cell group resistance based on the average cell group resistance and a mean cell group resistance.

7. The computer implemented method of claim 1, wherein the signal in response to the determining step is selected from the group consisting of a Warning message for a possible open cell in a cell group and an Alert message based on a high confidence of an open in a cell group.

8. The computer implemented method of claim 7, further including determining whether the average cell group resistance minus the mean cell group resistance is greater than a multiple of the standard deviation and wherein the Warning message is provided in response to the average cell group resistance minus the mean cell group resistance being less than the a multiple of the standard deviation and the Alert message being provided in response to the average cell group resistance minus the mean cell group resistance being equal to or greater than the a multiple of the standard deviation.

9. The computer implemented method of claim 6, wherein determining a standard deviation of the cell group resistance includes setting tuning parameter as a function of temperature.

10. A computer system for determining open connections in a cell group of a battery pack, the battery pack comprising a plurality of cell groups connected in series, the cell groups comprising a plurality of battery cells connected in parallel, comprising:
    one or more computer processors;
    one or more non-transitory computer-readable storage media;
    program instructions, stored on the one or more non-transitory computer-readable storage media, which when implemented by the one or more processors, cause the computer system to perform the steps of:
    measuring the voltage of each cell group of the plurality of cell groups as a function of time;
    obtaining a current level of the battery pack as a function of time;
    calculating the resistance of each cell group as a function of time based on the measured voltage less a nominal open circuit voltage divided by the current level of the battery pack;
    calculating the average cell group resistance of the battery pack as a function of time;
    determining that a cell group has an open connection based on the resistance of each cell group and the average cell group resistance; and
    providing a signal in response to the determining step.

11. The computer system of claim 10, wherein determining that a cell group has an open connection comprises using statistical analysis.

12. The computer system of claim 11, wherein the statistical analysis includes comparing a mean cell group resistance to the average cell group resistance.

13. The computer system of claim 10, wherein obtaining the current level of the battery pack comprises measuring the current level of the battery pack.

14. The computer system of claim 10, wherein obtaining the current level of the battery pack comprises calculating the estimated current level of the battery pack.

15. The computer system of claim 11, wherein the statistical analysis includes determining a standard deviation of the cell group resistance based on the average cell group resistance and a mean cell group resistance.

16. The computer system of claim 10, wherein the signal in response to the determining step is selected from the group consisting of a Warning message for a possible open cell in a cell group and an Alert message based on a high confidence of an open in a cell group.

17. The computer system of claim 16, further including determining whether the average cell group resistance minus the mean cell group resistance is greater than a multiple of the standard deviation and wherein the Warning message is provided in response to the average cell group resistance minus the mean cell group resistance being less than the a multiple of the standard deviation and the Alert message being provided in response to the average cell group resistance minus the mean cell group resistance being equal to or greater than the a multiple of the standard deviation.

18. The computer system of claim 15, wherein determining a standard deviation of the cell group resistance includes setting tuning parameter as a function of temperature.

19. A computer program product comprising:
    program instructions on a computer-readable storage medium, where execution of the program instructions using a computer causes the computer to perform a method for determining open connections in a cell group of a battery pack, the battery pack comprising a plurality of cell groups connected in series, the cell groups comprising a plurality of battery cells connected in parallel, comprising:

measuring the voltage of each cell group of the plurality of cell groups as a function of time;
  obtaining a current level of the battery pack as a function of time;
  calculating the resistance of each cell group as a function of time based on the measured voltage less a nominal open circuit voltage divided by the current level of the battery pack;
  calculating the average cell group resistance of the battery pack as a function of time;
  determining that a cell group has an open connection based on the resistance of each cell group and the average cell group resistance; and
  providing a signal in response to the determining step.

20. The computer program product of claim 19, wherein determining that a cell group has an open connection comprises using statistical analysis.

21. The computer program product of claim 20, wherein the statistical analysis includes comparing a mean cell group resistance to the average cell group resistance.

22. The computer program product of claim 19, wherein obtaining the current level of the battery pack comprises measuring the current level of the battery pack.

23. The computer program product of claim 19, wherein obtaining the current level of the battery pack comprises calculating the estimated current level of the battery pack.

24. The computer program product of claim 20, wherein the statistical analysis includes determining a standard deviation of the cell group resistance based on the average cell group resistance and a mean cell group resistance.

25. The computer program product of claim 19, wherein the signal in response to the determining step is selected from the group consisting of a Warning message for a possible open cell in a cell group and an Alert message based on a high confidence of an open in a cell group.

26. The computer program product of claim 25, further including determining whether the average cell group resistance minus the mean cell group resistance is greater than a multiple of the standard deviation and wherein the Warning message is provided in response to the average cell group resistance minus the mean cell group resistance being less than the a multiple of the standard deviation and the Alert message being provided in response to the average cell group resistance minus the mean cell group resistance being equal to or greater than the a multiple of the standard deviation.

27. The computer program product of claim 24, wherein determining a standard deviation of the cell group resistance includes setting tuning parameter as a function of temperature.

* * * * *